United States Patent
Belisle et al.

(10) Patent No.: US 12,052,813 B2
(45) Date of Patent: Jul. 30, 2024

(54) CIRCUIT MOUNTING ASSEMBLIES

(71) Applicant: Hamilton Sundstrand Corporation, Charlotte, NC (US)

(72) Inventors: Francis C. Belisle, Beloit, WI (US); Robert C. Cooney, Janesville, WI (US); Catherine Canciamille, Rockford, IL (US); Nhia Yang, Roscoe, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 9 days.

(21) Appl. No.: 17/943,980

(22) Filed: Sep. 13, 2022

(65) Prior Publication Data

US 2024/0090115 A1    Mar. 14, 2024

(51) Int. Cl.
*H05K 1/02* (2006.01)
*H05K 1/18* (2006.01)
*H05K 7/14* (2006.01)

(52) U.S. Cl.
CPC ......... *H05K 1/0203* (2013.01); *H05K 1/0271* (2013.01); *H05K 1/182* (2013.01); *H05K 7/1407* (2013.01)

(58) Field of Classification Search
CPC .... H05K 1/0203; H05K 1/0271; H05K 1/182; H05K 7/04; H05K 7/20; H05K 7/14; H05K 7/1404; H01B 17/14; B32B 31/00
See application file for complete search history.

(56) References Cited

U.S. PATENT DOCUMENTS

| | | | |
|---|---|---|---|
| 5,018,982 A * | 5/1991 | Speraw | H05K 7/142 439/74 |
| 5,703,753 A * | 12/1997 | Mok | H01L 23/552 174/16.3 |
| 6,096,414 A | 8/2000 | Young | |
| 6,304,450 B1 * | 10/2001 | Dibene, II | G06F 1/18 361/717 |
| 6,356,448 B1 * | 3/2002 | DiBene, II | H01R 12/52 257/713 |
| 6,477,053 B1 | 11/2002 | Zeidan et al. | |
| 6,493,233 B1 * | 12/2002 | De Lorenzo | H05K 7/142 361/752 |
| 6,999,318 B2 | 2/2006 | Newby | |
| 8,758,892 B2 | 6/2014 | Bergin et al. | |
| 10,558,274 B2 | 2/2020 | Glazier et al. | |
| 2009/0135564 A1* | 5/2009 | Chen | H05K 7/20472 361/709 |
| 2011/0157844 A1* | 6/2011 | Chan | G02F 1/133308 361/749 |
| 2012/0293963 A1 | 11/2012 | Slaton et al. | |
| 2013/0050954 A1* | 2/2013 | Albrecht, III | H05K 7/20454 361/720 |

(Continued)

OTHER PUBLICATIONS

European Search Report dated Feb. 15, 2024 in connection with European Patent Application No. 23197281.1, 7 pages.

*Primary Examiner* — Amir A Jalali

(57) ABSTRACT

A circuit mounting assembly can include a circuit board, a chassis, a sheet of thermally conductive dielectric material, and one or more fasteners configured to compress the sheet between the circuit board and the chassis to provide vibration isolation and electrical isolation between the chassis and the circuit board, and to provide thermal conduction between the chassis and the circuit board.

9 Claims, 4 Drawing Sheets

(56) References Cited

U.S. PATENT DOCUMENTS

| | | | |
|---|---|---|---|
| 2013/0093270 A1* | 4/2013 | Kokas | H05K 7/20518 |
| | | | 310/52 |
| 2017/0196075 A1* | 7/2017 | Barron | H01L 23/40 |
| 2019/0120870 A1* | 4/2019 | Cvach | B81B 7/0016 |
| 2020/0097049 A1 | 3/2020 | Dickenson | |

* cited by examiner

CIRCUIT MOUNTING ASSEMBLIES

FIELD

This disclosure relates to circuit mounting assemblies.

BACKGROUND

Compact electronic modules dissipate more heat than can be simply conductive cooled by mounting, so improved contact heat conduction is required. High voltage requires dielectric insulation between circuits and other conductors or chassis. Severe vibration environments require more fastener mounting points or stiffeners, or vibration isolation to attenuate vibration levels.

Such conventional methods and systems have generally been considered satisfactory for their intended purpose. However, there is still a need in the art for circuit mounting assemblies. The present disclosure provides a solution for this need.

SUMMARY

A circuit mounting assembly can include a circuit board, a chassis, a sheet of thermally conductive dielectric material, and one or more fasteners configured to compress the sheet between the circuit board and the chassis to provide vibration isolation and electrical isolation between the chassis and the circuit board, and to provide thermal conduction between the chassis and the circuit board.

The circuit board and sheet can have a one or more corresponding fastener holes configured to align such that the one or more fasteners can pass through each of the plurality of fastener holes. The chassis can define one or more bosses extending from a base of the chassis. Each of the one or more bosses can align with the one or more of fastener holes of the circuit board and sheet.

The one or more fasteners can be threaded fasteners. Each boss can define or include a threaded opening for receiving a respective fastener. Each boss can define a post shape with a chamfered edge. The sheet can be configured to deform around at least a portion of each boss. In certain embodiments, the sheet can be configured to fill in an air gap between the circuit board and the chassis when compressed.

The one or more fasteners can include a shoulder between a head and a threaded portion. The shoulder can be configured to extend through the circuit board and the sheet such that the threaded portion is exposed past the sheet when the head is limited by the circuit board. The shoulder can have a length designed to cause a predetermined sheet compression. The shoulder can be shaped to be limited by the boss. A washer can be disposed between the fastener head and the circuit board.

In certain embodiments, the chassis can have one or more thermal posts without fasteners and configured to conduct from one or more hotspots of the circuit board. Any suitable number of thermal posts of any suitable height (e.g., varying height for a plurality of thermal posts, e.g., to conform to the varying height of the circuit board and/or components).

In accordance with at least one aspect of this disclosure, an aircraft electrical system can include a circuit mounting assembly. The circuit mounting assembly can be any assembly disclosed herein, e.g., as described above.

In accordance with at least one aspect of this disclosure, a method can include compressing a sheet of thermally conductive dielectric material between a circuit board and an electrically conductive chassis to provide vibration isolation, electrical isolation, and thermal transfer between the circuit board and the chassis. The method can include any other suitable method(s) and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
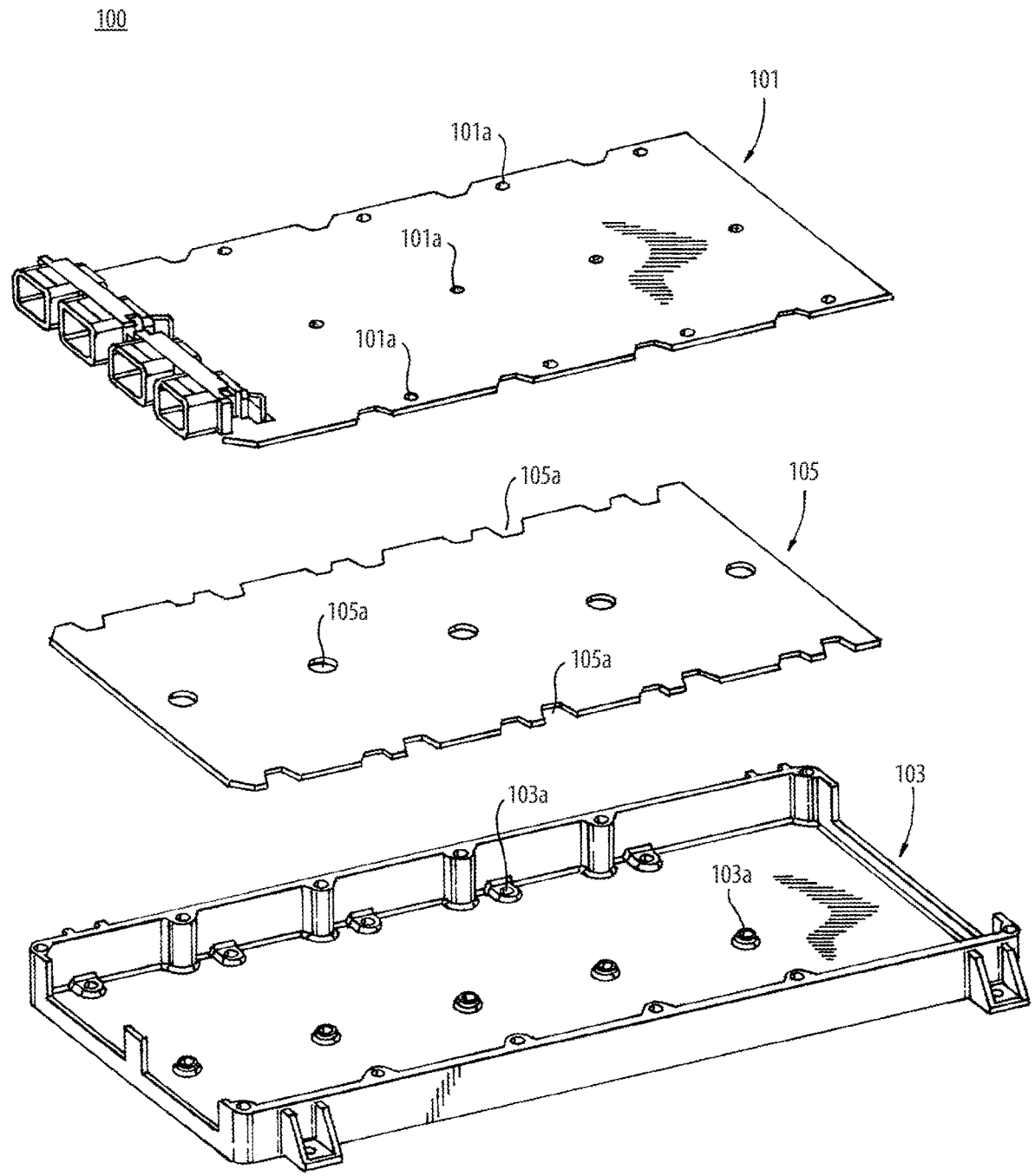
FIG. 1 is an exploded view of an embodiment of an assembly in accordance with this disclosure, wherein fasteners are not shown.
Figure 2:
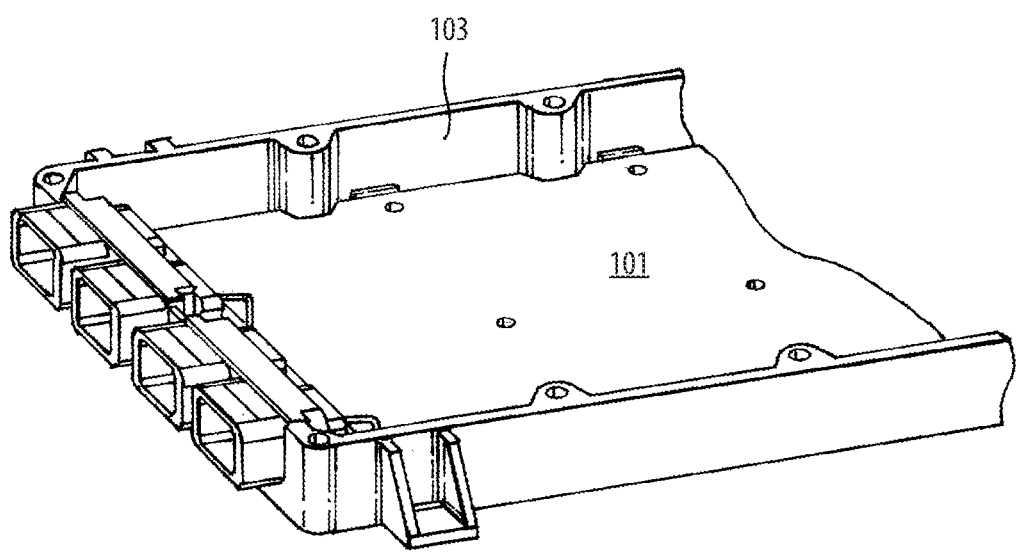
FIG. 2 is a partial assembled view of the embodiment of FIG. 1.
Figure 3:
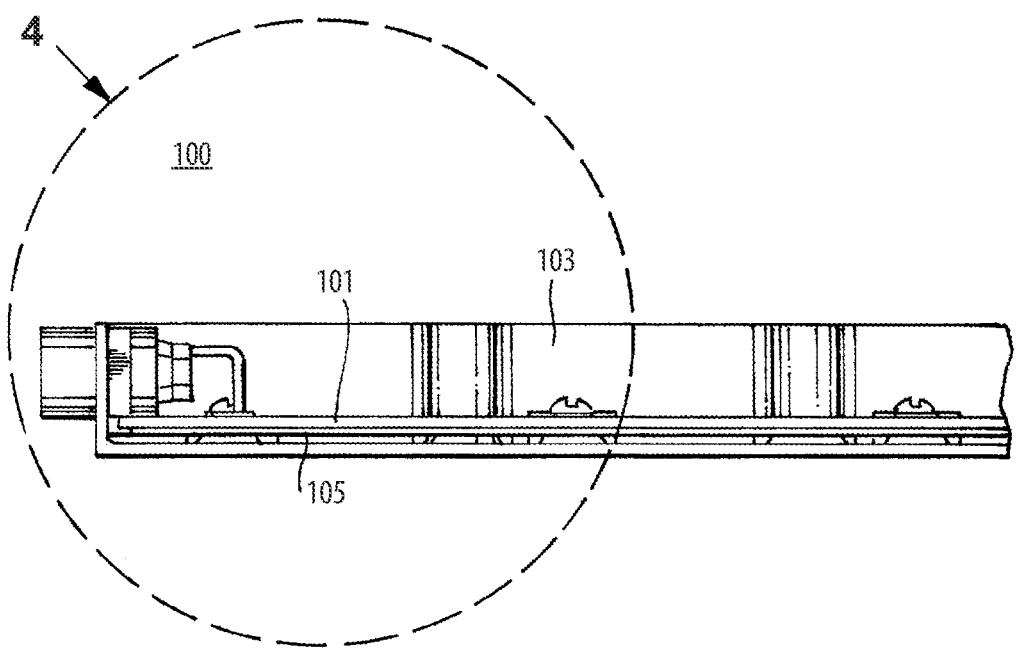
FIG. 3 is a cross-sectional elevation view of the embodiment of FIG. 2.
Figure 4:
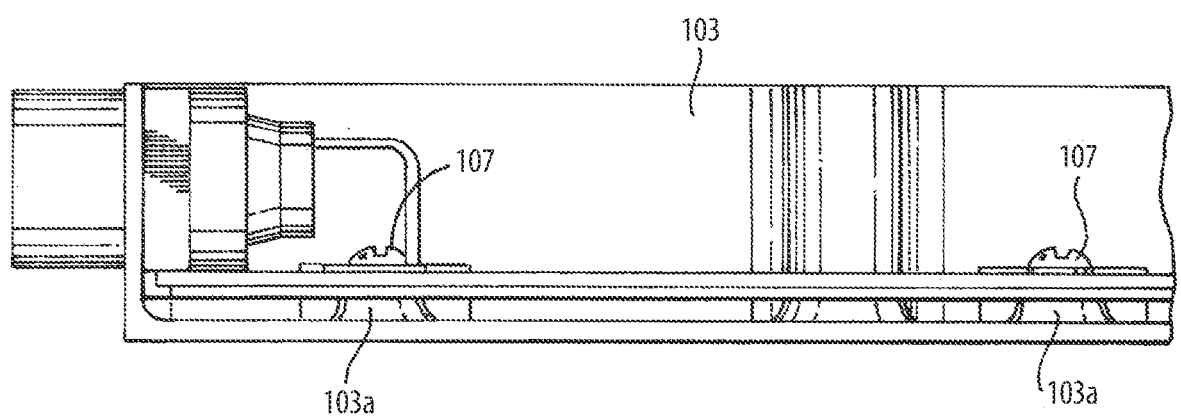
FIG. 4 is a zoomed view of a portion of the embodiment of FIG. 3.

Reference will now be made to the drawings wherein like reference numerals identify similar structural features or aspects of the subject disclosure. For purposes of explanation and illustration, and not limitation, an illustrative view of an embodiment of an assembly in accordance with the disclosure is shown in FIG. 1 and is designated generally by reference character 100. Other embodiments and/or aspects of this disclosure are shown in FIGS. 2-6B.

Referring to FIGS. 1-5, a circuit mounting assembly 100 can include a circuit board 101, a chassis 103, and a sheet 105 of thermally conductive dielectric material. The assembly 100 can also include one or more fasteners configured to compress the sheet 105 between the circuit board 101 and the chassis 103 to provide vibration isolation and electrical insolation between the chassis 103 and the circuit board 101, and to provide thermal conduction between the chassis 103 and the circuit board 101.

Figure 5:
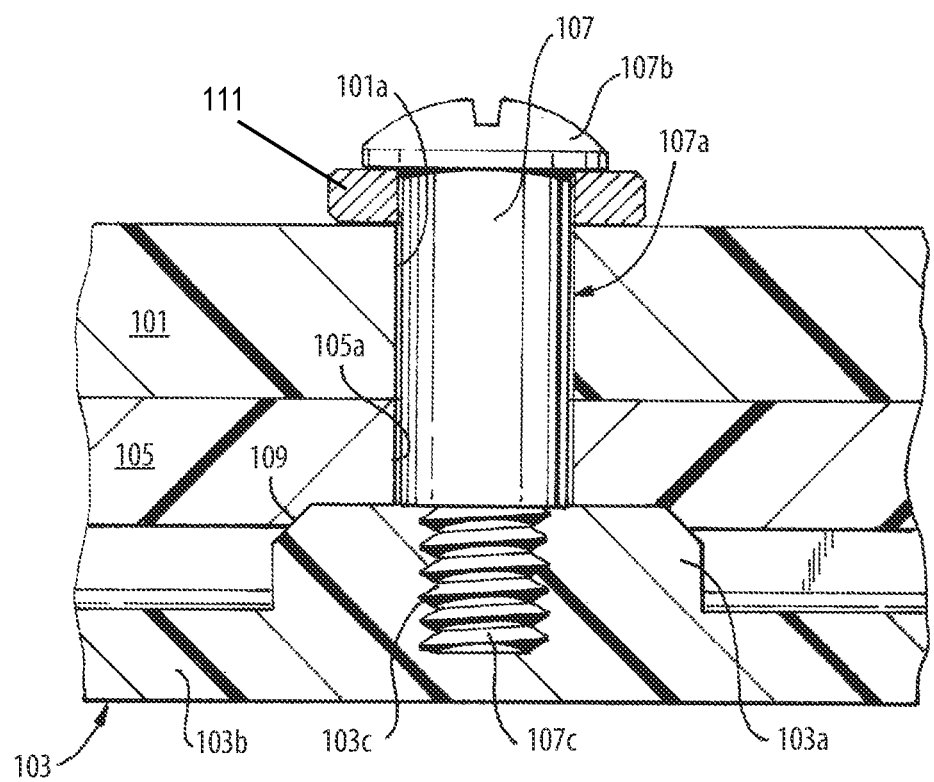
FIG. 5 is a cross-sectional schematic view of a portion of the embodiment of FIG. 1, showing a fastener installed.
Figure 6A:
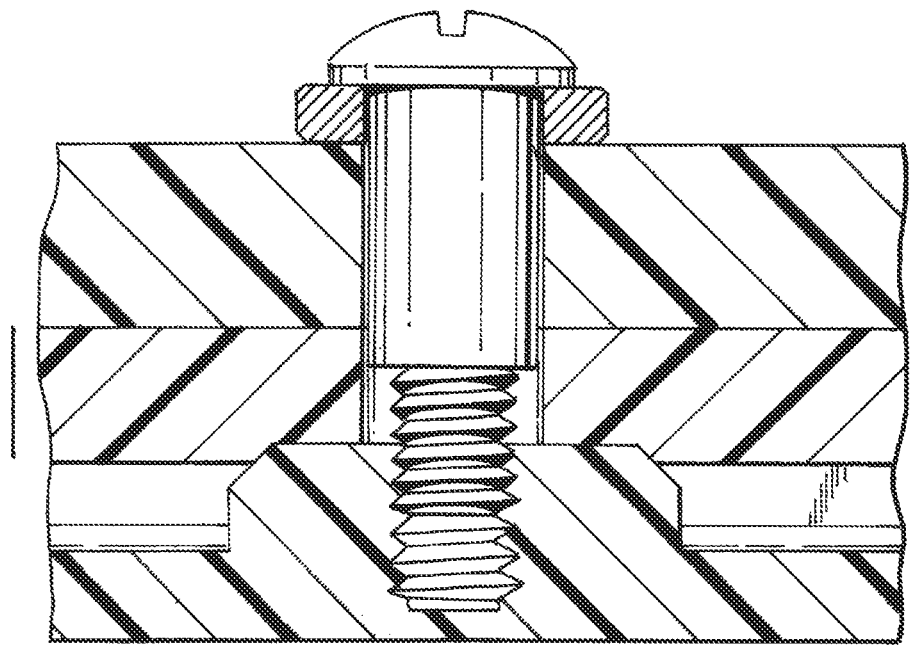
FIG. 6A is a partial cross-sectional view of an embodiment of an assembly in accordance with this disclosure, shown having a fastener partially installed.
Figure 6B:
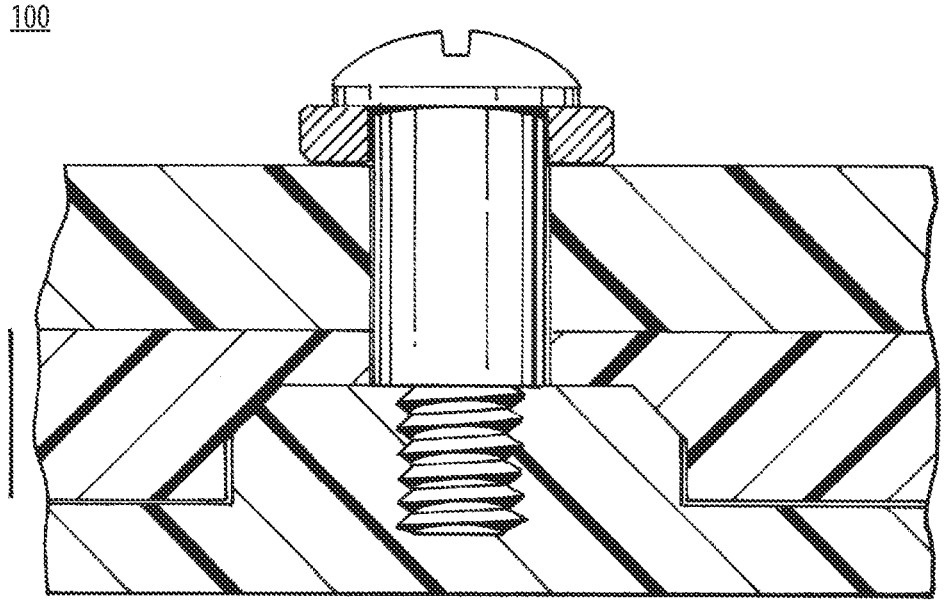
FIG. 6B is a partial cross-sectional view of the embodiment of FIG. 6A, shown having a fastener fully installed and limited by a boss of a chassis.

The circuit board 101 and sheet 105 can have a one or more corresponding fastener holes 101a, 105a configured to align such that the one or more fasteners 107 (e.g., as shown in FIGS. 5 and 6A-6B) can pass through each of the plurality of fastener holes 101a, 105a. The chassis 103 can define one or more bosses 103a extending from a base 103b of the chassis 103. Each of the one or more bosses 103a can align with the one or more of fastener holes 101a, 105a of the circuit board 101 and sheet 105.

The one or more fasteners 107 can be threaded fasteners, for example (e.g., as shown). Each boss 103a can define or include a threaded opening 103c for receiving a respective fastener 107 (e.g., a threaded portion 107c thereof). Each boss 103 can define a post shape (e.g., a round or other cross-sectional shape) with a chamfered edge 109 (e.g., and/or otherwise angled, curved, and/or smooth). The sheet 105 can be configured to deform around at least a portion of each boss 103 (e.g., as shown in FIGS. 5-6B). In certain embodiments, the sheet 105 can be configured to fill in an air gap between the circuit board 101 and the chassis 103 when compressed.

The one or more fasteners 107 can include a shoulder 107a between a head 107b and a threaded portion 107c. The shoulder 107a can be configured to extend through the circuit board 101 and the sheet 103 such that the threaded portion 107c is exposed past the sheet 105 when the head 107b is limited by the circuit board 101 (e.g., when the head 107b is contacting or pressing a washer 111 against the circuit board 101). The shoulder 107a can have a length designed to cause a predetermined sheet compression, for example. For example, the shoulder can be shaped to be limited by the boss 103, e.g., as shown in FIG. 5 and FIG. 6B, which limits the amount of compression of the sheet 105.

In certain embodiments, a washer 111 can be disposed between the fastener head 107b and the circuit board 101, the thickness of which can be accounted for when selecting a length of the shoulder-107a.

The boss 103a can act as a support and a heat transfer point for the circuit card 101 through the thermally conductive sheet 105. The sheet 105 can be elastic and made of any suitable thermally conductive dielectric material. For example, the sheet 105 can be a ceramic polymer. An example of a commercially available product is a Gap Pad™ made by The Bergquist Company™, having a principle place of business of 18930 West 78th Street, Chanhassen, MN 55317, Cage Code 55285. In certain embodiments, the dielectric breakdown voltage of the sheet 105 can be 6000 VAC minimum, and the thermal Conductivity can be 1.0 W/m-K.

In certain embodiments, the chassis 103 can have one or more thermal posts (e.g., extending up from the chassis similar to the one or more bosses) without fasteners and configured to conduct from one or more hotspots of the circuit board 101. Any suitable number of thermal posts of any suitable height (e.g., varying height for a plurality of thermal posts, e.g., to conform to the varying height of the circuit board 101 and/or components).

FIG. 6A shows an embodiment of an assembly in accordance with this disclosure, shown having a fastener partially installed. FIG. 6B shows the embodiment of FIG. 6A, shown having a fastener fully installed and limited by a boss of a chassis. As shown, the compression deforms the sheet 105 to fill the open space between the chassis 103 and the circuit board 101.

In accordance with at least one aspect of this disclosure, an aircraft electrical system can include a circuit mounting assembly. The circuit mounting assembly can be any assembly disclosed herein, e.g., as described above.

In accordance with at least one aspect of this disclosure, a method can include compressing a sheet of thermally conductive dielectric material between a circuit board and an electrically conductive chassis to provide vibration isolation, electrical isolation, and thermal transfer between the circuit board and the chassis. The method can include any other suitable method(s) and/or portion(s) thereof.

Embodiments include a module assembly with a thermally conductive, dielectric barrier, vibration isolation sheet installed. Fastener holes can be sized to be just big enough for desired fasteners to pass through (or slightly larger to account for deformation when compressed). The holes can have any suitable location for any suitable application, and there can be any suitable number of fasteners/holes. Certain embodiments can include three or more for stability when installed. The fastener holes can be coordinated with the size of mounting fasteners (e.g., a shoulder size, a head size, a washer size, etc.) such that the fastener can displace the circuit board 101 to compress sheet 105 when attached to the chassis 101. Sheet thickness and amount of compression can be selected/optimized to control a stiffness/vibration and the thermal conductivity of the system. The less compression and/or more thickness, the more flexible the system will be, which can be better for handling vibration. However, more thickness and less compression may sacrifice thermal conductivity. Certain embodiments can include a 50% sheet compression (e.g., if the sheet is 40 thousands of an inch thick, it is compressed to 20 thousands of an inch of thickness).

In certain embodiments, the sheet 105 can be compressed such that the sheet 105 contacts that based 103b of the chassis 103, e.g., as shown in FIGS. 6A and 6B. Primary thermal transfer may be through each boss 103a due to better contact. In certain embodiments, the chassis can have posts that are not made to accept fasteners and are configured to contact the sheet 105 to improve thermal transfer in those locations (e.g., where there is a hotspot, the sheet 105 can compress against the thermal post). Embodiments of a boss 103 (or other post) can include a corner break (e.g., a chamfer or radius) so that there is no corner or no sharp edge to damage the dielectric material.

In certain embodiments, the fastener can be used to ground a component from top side of circuit board to the chassis. Embodiments can include chassis mounting points that have thread inserts of the mounting fasteners The bosses 103 (e.g., chassis mounting points) can be sized and positioned as desired for support and suitable heat sink. Fasteners can be shoulder bolts or spacer tubes for controlled compression (e.g., displacement) of the thermally conductive dielectric material. Shoulder height can be varied depending on how much compression is needed for thickness of dielectric material. Chassis support point (mounting boss) heat sink area Embodiments can include a high heat generating printed wiring board assembly (PWBA) module and specific components clamped to a chassis for heat rejected by conduction to the chassis. The PWBA can include a large number (e.g., more than 10) of mounting points for vibration support and heat sinking to chassis. Embodiments can include a PWBAs with high voltage and a dielectric barrier between the PWBA components and chassis to reduce the possibility for a FOD or arcing short to chassis. Embodiments can include PWBA module designed to compensate for tolerance of component height in the mounting of high heat dissipation parts to chassis. Having a vibration isolation sheet material at all the mounting points means the vibration input to the module is reduced, and no module stiffener is required, and/or much higher vibration loading could be survived.

Certain embodiments can include an integrated mounting approach of a PWBA module using a flexible, compressible, high thermal conductivity, dielectric sheet, which the PWBA module is mounted on and then clamped by fasteners to chassis mounting heat sink points. The thermally conductive dielectric material can be a compressed interface between the circuit board and chassis. The compression can be controlled by shoulder bolts, for example. The compressed thermally conductive dielectric material can provide a vibration isolation or damping interface.

Certain compact printed wiring board assemblies or electronic modules dissipate more heat than can be conductive cooled by perimeter edge mounting, so improved contact heat conduction can be beneficial at component locations. Harsh environments of fluids or contaminations can require certain modules to be environmentally sealed which prevents the usage of natural convection cooling, which makes the modules cooling depend on chassis heat conduction and heat rejection to the environment. Accordingly, certain embodiments include a circuit board sealed within the chassis that can be only cooled by conductive cooling.

High voltage applications can require dielectric insulation between circuits and chassis or adjacent components because, as voltage increases, a simple conformal coating of components may not provide sufficient dielectric protection. High amperage applications can require physical distance separation between dissimilar functions or isolation barriers between the functions. Large size modules can have high vibration displacements in severe vibration environments and either require more fastener mounting points, or stiffeners, or vibration isolation to reduce input levels. Embodiments can include an integrated mounting approach of a PWBA or other module assembly using a flexible, compressible, highly thermally conductive, dielectric sheet material, which the PWBA or other suitable module is mounted on and then clamped by mounting fasteners to chassis mounting heat sink points. In such embodiments, the thermally conductive dielectric material forms the mounting interface between the module assembly and the mounting heat sink for direct thermal conduction to the chassis with high dielectric strength. The thermally conductive dielectric material as a compressed interface between the module assembly and the chassis provides a vibration isolation or damping interface to reduce dynamic loads into the modules. Controlled compression of the thermally conductive dielectric material can be facilitated by using shoulder spacers, shoulder bolts, or controlled fastener installation depth. If shoulder bolts or shoulder spacers are conductive metal, the module assembly mounting points can be designed to provide electrical ground connections from the PWB to the chassis. The thermally conductive dielectric material, with reinforced material construction, provides a continuous dielectric and fault isolation barrier between the module and the chassis.

Embodiment can provide direct thermal heat conduction paths between module assembly and chassis at the module mounting points. Embodiments can allow flexibility for module components to be in direct compression contact with a thermal conduction sheet to the chassis surface for specific component conduction cooling. Embodiments can provide vibration isolation at module mounting system to reduce vibration dynamic loading and avoids the need for module stiffeners to reduce assembly deflection stress. Embodiments can provide a continuous sheet of dielectric material between the module and the chassis to facilitate high voltage circuit protection and for system voltage isolation to chassis. Embodiments can provide a physical protection for modules that required physical or segregation protection barriers to adjacent chassis or structure. The flexible, compressible sheet material can be used to compensate for height of high heat generating components to provide proper mounting thermal heat sink connection to chassis. Embodiments can include an integration of a flexible thermally conductive film material for dielectric barrier. Embodiments can be applied to embedded controls, power supplies, high voltage motor controllers, and power distribution equipment, for example, or any other suitable application.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit mounting assembly, comprising:
   a circuit board;
   a chassis;
   a sheet of thermally conductive dielectric material; and
   one or more fasteners configured to compress the sheet between the circuit board and the chassis to provide vibration isolation and electrical isolation between the chassis and the circuit board and to provide thermal conduction between the chassis and the circuit board, wherein the circuit board and the sheet have corresponding fastener holes configured to align such that the one or more fasteners are able to pass through the fastener holes, wherein the chassis defines one or more bosses extending from a base of the chassis, wherein the one or more bosses align with the fastener holes of the circuit board and the sheet, wherein the one or more fasteners are threaded fasteners, wherein each boss defines or includes a threaded opening for receiving a respective fastener, wherein each boss defines a post shape with a chamfered edge, and wherein the sheet is configured to deform around at least a portion of each boss such that the sheet is configured to deform more between each boss of the chassis and the circuit board than between a non-boss portion of the chassis and the circuit board.

2. The circuit mounting assembly of claim 1, wherein the sheet is configured to fill in an air gap between the circuit board and the chassis when compressed.

3. The circuit mounting assembly of claim 2, wherein the one or more fasteners include a shoulder between a head and a threaded portion, wherein the shoulder is configured to extend through the circuit board and the sheet such that the threaded portion is exposed past the sheet when the head is limited by the circuit board, wherein the shoulder has a length designed to cause a predetermined sheet compression.

4. The circuit mounting assembly of claim 3, wherein the shoulder is shaped to be limited by one of the one or more bosses.

5. The circuit monitoring assembly of claim 1, wherein the chassis has one or more thermal posts without fasteners and configured to conduct from one or more hotspots of the circuit board.

6. An aircraft electrical system, comprising:
   a circuit mounting assembly having:
     a circuit board;
     a chassis;
     a sheet of thermally conductive dielectric material; and
     one or more fasteners configured to compress the sheet between the circuit board and the chassis to provide vibration isolation and electrical isolation between the chassis and the circuit board and to provide thermal conduction between the chassis and the circuit board, wherein the circuit board and the sheet have corresponding fastener holes configured to align such that the one or more fasteners are able to pass through the fastener holes, wherein the chassis defines one or more bosses extending from a base of the chassis, wherein the one or more bosses align with the fastener holes of the circuit board and the sheet, wherein the one or more fasteners are threaded fasteners, wherein each boss defines or includes a threaded opening for receiving a respective fastener, wherein each boss defines a post shape with a chamfered edge, and wherein the sheet is configured to deform around at least a portion of each boss such that the sheet is configured to deform more between each boss of the chassis and the circuit board than between a non-boss portion of the chassis and the circuit board.

7. The system of claim 6, wherein the sheet is configured to fill in an air gap between the circuit board and the chassis when compressed.

8. The system of claim 7, wherein the one or more fasteners include a shoulder between a head and a threaded portion, wherein the shoulder is configured to extend through the circuit board and the sheet such that the threaded portion is exposed past the sheet when the head is limited by the circuit board, wherein the shoulder has a length designed to cause a predetermined sheet compression.

9. The system of claim 8, wherein the shoulder is shaped to be limited by one of the one or more bosses.

* * * * *